US012719235B2

(12) United States Patent
Malea et al.

(10) Patent No.: US 12,719,235 B2
(45) Date of Patent: Aug. 25, 2026

(54) LASER DIODE DISPLAY

(71) Applicant: Google LLC, Mountain View, CA (US)

(72) Inventors: Daniel Malea, Waterloo (CA); Bergen Albert Fletcher, St. Jacobs (CA); Matthew Broga, Kitchener (CA); Nathniel Ayalew, Waterloo (CA)

(73) Assignee: Google LLC, Mountain View, CA (US)

( * ) Notice: Subject to any disclaimer, the term of this patent is extended or adjusted under 35 U.S.C. 154(b) by 969 days.

(21) Appl. No.: 17/929,880

(22) Filed: Sep. 6, 2022

(65) Prior Publication Data

US 2024/0079851 A1 Mar. 7, 2024

(51) Int. Cl.

| | |
|---|---|
| ***G02B 26/08*** | (2006.01) |
| ***G02B 26/10*** | (2006.01) |
| ***H01S 5/00*** | (2006.01) |
| ***H01S 5/06*** | (2006.01) |
| ***H01S 5/062*** | (2006.01) |
| ***H01S 5/068*** | (2006.01) |
| ***H01S 5/40*** | (2006.01) |

(52) U.S. Cl.

CPC ............ *H01S 5/068* (2013.01); *G02B 26/101* (2013.01); *H01S 5/0071* (2013.01); *H01S 5/0617* (2013.01); *H01S 5/062* (2013.01); *H01S 5/40* (2013.01)

(58) Field of Classification Search

CPC ...... H01S 5/068; H01S 5/0071; H01S 5/0617; H01S 5/062; H01S 5/40; H01S 5/06804; G02B 26/101; G03B 21/2066; G03B 21/20; G03B 21/2013; G03B 21/2033

See application file for complete search history.

(56) References Cited

U.S. PATENT DOCUMENTS

| | | | | |
|---|---|---|---|---|
| 4,803,497 A | 2/1989 | Kennedy et al. | | |
| 5,680,410 A | 10/1997 | Kim et al. | | |
| 2009/0097507 A1 | 4/2009 | Zhu et al. | | |
| 2009/0161708 A1* | 6/2009 | Kawai | H01S 5/0687 372/34 | |
| 2019/0229495 A1* | 7/2019 | Pierer | G02B 27/01 | |
| 2020/0101759 A1* | 4/2020 | Kato | B41J 2/1623 | |
| 2022/0393426 A1* | 12/2022 | Shahin | G02B 26/0833 | |

OTHER PUBLICATIONS

Cantore, et al., "High Luminous Flux From Signle Crystal Phosphor-Converted Laser-Based White Lighting System", Optica Publishing Group, Optics Express, vol. 24, Issue 2, 2016, pp. A215-A221.

* cited by examiner

*Primary Examiner* — Euncha P Cherry

(74) *Attorney, Agent, or Firm* — Brake Hughes Bellermann LLP

(57) ABSTRACT

A laser display may include a light engine, which includes a laser diode and a temperature sensor configured to measure a temperature of the laser diode. The light engine may be coupled to a controller configured to determine a drive current for the laser diode to generate an optical power based on a threshold of the laser diode and an efficiency of the laser diode. The controller is configured to calculate the threshold and the efficiency of the laser diode at the measured temperature using a threshold model and an efficiency model of the laser diode, which are generated using a calibration process.

20 Claims, 7 Drawing Sheets

LASER DIODE DISPLAY

FIELD OF THE DISCLOSURE

The present disclosure relates to a display using laser diodes light sources and more specifically to systems and methods for controlling the laser diodes.

BACKGROUND

Lasers may be used as light sources for display. For example, a red laser, green laser, and blue laser may be scanned and projected to create color images. The drive level of each laser may be carefully controlled over time to generate color images with consistent and accurate color and brightness.

SUMMARY

A laser display configured to project light from at least one laser diode is disclosed. The laser display uses thermal feedback to compensate for optical power variations that can occur due to changes in the temperature of the laser diode. The compensation is based on estimates of a threshold and an efficiency of the laser diode for a measured temperature. Accordingly, the disclosure also includes methods to obtain thermal models of threshold and efficiency, which can be used as a basis of the compensation.

In some aspects, the techniques described herein relate to a laser display including: a light engine including a laser diode and a temperature sensor configured to measure a temperature of the laser diode; and a controller coupled to the light engine configured to receive the temperature, the controller configured to: receive a pixel (e.g., color pixel) for display; determine an optical power corresponding to the pixel; determine a drive-current for the optical power from a relationship, the relationship being based on: a threshold of the laser diode at the temperature computed using a threshold model of the laser diode; and an efficiency of the laser diode at the temperature computed using an efficiency model of the laser diode; and transmit the drive-current to a driver configured to supply the drive-current to the laser diode.

In some aspects, the techniques described herein relate to a method for calibrating a laser display, including heating a laser diode to a plurality of temperatures: determining a plurality of thresholds and a plurality of efficiencies for the laser diode at the plurality of temperatures by: at each temperature, generating a plurality of pulses of light from the laser diode using a plurality of drive currents; at each temperature, measuring a plurality of optical powers for the plurality of pulses of light from the laser diode using a photodiode; at each temperature, determining a threshold and an efficiency of the laser diode based on the plurality of drive currents and the plurality of optical powers; computing a threshold model of the laser diode based on the plurality of thresholds determined at the plurality of temperatures; computing an efficiency model of the laser diode based on the plurality of efficiencies determined at the plurality of temperatures; and calibrating the laser display based on the threshold model and the efficiency model.

In some aspects, the techniques described herein relate to a method for controlling a laser display, including: receiving a pixel for display on the laser display; determining an optical power corresponding to the pixel; determining a drive-current for the optical power from a relationship, the relationship being based on: a threshold of a laser diode of the laser display at a temperature, the threshold computed using a threshold model of the laser diode; and an efficiency of the laser diode at the temperature computed using an efficiency model of the laser diode; and transmitting the drive-current to a driver configured to supply the drive-current to the laser diode so that the laser diode emits light at the optical power.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other. Like reference numerals designate corresponding parts throughout the several views.

DETAILED DESCRIPTION

Figure 1:
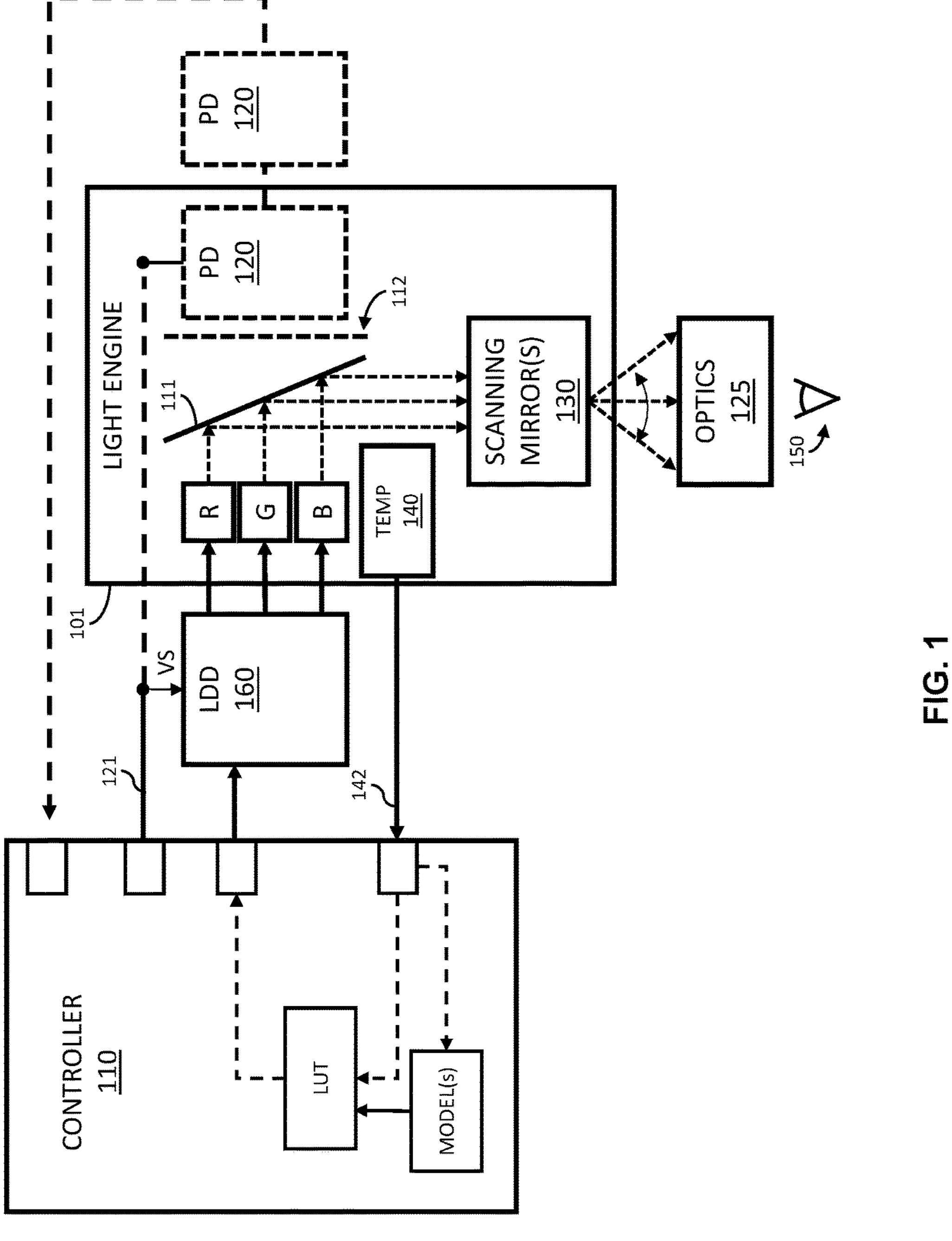
FIG. 1 is a system block diagram of a laser display according to a possible implementation of the present disclosure.

The laser display described here can utilize a set of lasers to generate colors (e.g., red, green, blue) that can be combined and scanned by mirrors in a scanning mirror assembly. For example, a spot (i.e., pixel) of combined colors can be scanned (e.g., in a raster scan) across a row using a fast mirror and shifted between rows using a slow mirror. In other words, the lasers and mirrors may operate as a flying-spot scanner (i.e., flying-spot projector) that can scan light from the lasers. For a heads-up display (HUD), such as used in an augmented reality (AR) device (e.g., AR glasses), display optics can focus the scanned light to form an image on the retina of the user.

During a scan, the lasers in the laser display can be driven simultaneously at different drive currents to form different colors and brightness levels. It may be highly desirable to provide images having consistent brightness and colors over time (i.e., as conditions change) and between different devices. This control may be based on optical feedback to determine the output optical power of each laser. During a portion of a scan, an optical power of each laser may be measured by a photodiode to determine a drive level adjustment (i.e., error signal) necessary to prevent unwanted intensity fluctuations in the display intensity. The optical feedback approach faces a few technical problems.

First, the optical feedback approach can require a photodiode to be integrated with the laser display (e.g., the light engine) and may require an analog-to-digital converter to facilitate the feedback. This added complexity can increase circuit size, circuit cost, and power consumption of the laser display. These increases may not be practical for mobile and/or space constrained applications. For example, a heads-up display for augmented reality glasses may not be able to reasonably utilize the optical feedback approach.

Second, the optical feedback approach requires measuring the laser diode output power during a scan. This added measuring step can reduce a viewable area of the display. For example, in the flying-spot projector, baffling may be used to block the light at the edges of a scanning mirror to prevent a user from seeing pulses required for the optical power measurement. This baffling reduces the power of the light that could otherwise be used for display, thereby effectively reducing the optical efficiency of the display, which may be observed as a reduction in brightness and/or dynamic range of the laser display Disclosed herein are systems and methods to control lasers in a laser display using thermal feedback, instead of optical feedback, to control the lasers during a display scan. The thermal feedback approach may have the technical effect of simplifying the circuitry and increasing the optical efficiency of the laser display, as compared to the optical feedback approach. The simplified circuitry and increased optical efficiency can reduce power consumption, which can correspond to increased battery life in a mobile device (e.g., smart glasses). The thermal feedback approach may also have the technical effect of simplifying the optics, which can be observed as an increase in brightness and dynamic range of the laser display.

The present disclosure describes a laser display suitable for use as a heads-up display (HUD). The HUD may be implemented in an augmented reality (AR) system, such as AR glasses. The HUD for AR glasses will be the implementation referred to herein, though other implementations are possible using the disclosed technology.

FIG. 1 is a system block diagram of a laser display according to a possible implementation of the present disclosure. The laser display 100 includes a light engine 101. The light engine includes at least one laser diode. For example, the light engine may include a red laser-diode (R) a green laser-diode (G), and a blue laser-diode (B). The red laser-diode can be driven with a red drive-current, the green laser-diode can be driven with a green drive-current, and the blue laser-diode can be driven with a blue drive-current so that the red, green, and blue light from the laser diodes forms a color on the visible spectrum when combined. While the laser display may include other laser diode configurations (e.g., one laser, alternate colors, etc.), the red, green, and blue (R,G,B) color laser diode configuration will be discussed herein.

The light engine 101 may further include a beam splitter 111 configured to route a first portion of the light from the lasers to a scanning mirror assembly 130 and a second portion of the light from the lasers (R, G, B) to a test port 112. A photodiode 120 may be temporarily configured to sense light at the test port 112. For example, during a calibration process, which will be described in further detail, a photodiode 120 that is internal or external to the light engine 101 may be configured to detect light at the test port 112 and measure a plurality of optical powers (e.g., measured milliwatts (mW)) for a plurality of drive currents (e.g., measured in milliamps (mA)) for each laser (R, G, B).

In a possible implementation, the photodiode 120 can be part of test equipment (i.e., test fixture) used with the laser display 100 for a calibration process at the time of fabrication and then removed prior to use by a user. The test equipment may include an analog-to-digital converter configured to convert analog signals from the photodiode 120 into digital measurements that can be transmitted to a controller 110 over a digital communication bus 121 (e.g., serial peripheral interface (SPI)) shared by other devices or over a dedicated communication channel.

The light engine 101 further includes a scanning mirror assembly 130. The scanning mirror assembly 130 may be configured to collect and reflect light from the beam splitter 111 according to a scan of the laser display 100. In a possible implementation the scanning mirror assembly includes a plurality of mirrors that are configured to scan in a plurality of directions at a plurality of scan rates. For example, the scanning mirror assembly 130 may include a fast mirror configurable to scan in a first direction (e.g., horizontal direction) relative to an eye of a user and a slow mirror configuration to can in a second direction (e.g., vertical direction) relative to the eye of the user, where the second direction is approximately orthogonal to the first direction. The scan rate of the fast mirror may be faster than the scan rate of the slow mirror so that the light from the beam splitter can be raster scanned on a frame-by-frame basis. For example, the fast mirror may scan a thousand times per frame to form rows of an image while the slow mirror is scanned once per frame to move the scanned beam between rows of the frame. The light from the mirrors may be received by and focused by display optics 125 to form an image at an eye 150 of a user (e.g., on a retina of the eye).

The light engine 101 may further include a temperature sensor 140. The temperature sensor 140 may be disposed in the light engine 101 proximate to the lasers (R, G, B) so that a temperature measured by the temperature sensor 140 approximates the temperature of at least one of the lasers. In a possible implementation, the temperature sensor 140 is disposed on a semiconductor substrate (i.e., die) with the laser diodes so that the temperature measured (i.e., measured temperature) is the approximate temperature (e.g., within 5%) of the red laser diode (R), the green laser diode (G), and the blue laser diode (B). In a possible implementation, temperature sensor 140 includes an analog-to-digital converter to communicate a digital measurement of the temperature to a controller via a temperature bus 142 configured for digital communication (e.g., I2C).

The laser display 100 may further include a controller 110. The controller 110 may be configured to generate signals to control the operation of the laser or lasers (R, G, B) of the light engine 101. For example, the controller may be configured to transmit drive current signals to a laser diode driver (LDD 160). In a possible implementation, the controller 110 may be configured to transmit a red drive-current corresponding to the red laser-diode, a blue drive-current corresponding to the blue laser-diode, and a green drive-current corresponding to the green laser-diode to the LDD 160, which is configured to transmit corresponding analog currents to each laser diode so that each laser diode emits an optical power according to the drive current.

The controller 110 may modulate the drive currents applied to each laser diode during a scan so that a color image may be formed at the eye 150 of the user. The controller may also adjust a gain of the LDD 160 to set a brightness and whitepoint of images generated by the laser display 100. In other words, the controller may communicate a video scale (VS) signal to the LDD 160 to set a maximum current supplied to the laser diodes. The video scale (VS) signal may be communicated to the LDD 160 over the digital communication bus 121 to control the gain of the LDD. The video scale (VS) may correspond to an optical power target.

The optical power target may be based on ratios of the optical powers of the red (R), green (G), and blue (B) light from the lasers. The ratio of red, green, and blue optical power targets determines the shade of "white" on the display (i.e., whitepoint). Accordingly, the optical power target may include optical powers for the lasers (R, G, B) to achieve a whitepoint of the display. The optical power target may further include optical powers for the lasers (R, G, B) to achieve a brightness of the display. For example, in an outdoor mode, the optical power target for brightness may correspond to the maximum power each laser can generate, while maintaining the whitepoint.

During a calibration process, the controller 110 may be configured to compare the maximum power output to the optical power target. If the measured optical power is below the optical power target, then the VS of the LDD 160 can be increased (e.g., stepwise) until the measured optical power (e.g., by photodiode 120) is within a threshold range of the optical power target. Likewise, if the measured optical power (e.g., by photodiode 120) is above the optical power target, then the VS of the LDD can be decreased (e.g., stepwise) until the measured optical power is within a threshold range of the optical power target.

Each laser diode (R, G, B) is configured to generate an optical power (OPT_PWR) for an applied drive current (DRIVE_CURRENT) according to a curve (i.e., L-I curve) that can be approximated based on a threshold current (TH) and an efficiency (EFF) of the laser diode. For example, the threshold current (TH) may be considered the drive current at which the laser diode turns ON and maintains a minimum optical power (e.g., 0.5 milliwatt (mW)), while the efficiency (EFF) may correspond to the amount of optical power change for a given drive current change (i.e., slope) for drive currents above the threshold.

A problem with driving a laser diode in a real environment is that the threshold (TH) and/or efficiency (EFF) of each laser diode may change with temperature. For example, when a laser diode is at a lower temperature, it may generate optical power more efficiently than when the laser diode is at a higher temperature. Accordingly, to generate a pixel, the controller may be configured to determine how much drive current is necessary for each laser diode based on a temperature of the laser diode. A calibration process can be used to prescribe how much drive current is needed for a given optical power based on a measured temperature of the laser diodes so that this determination can be made during operation. The result of the calibration may be a relationship (e.g., look-up table (LUT)) through which a drive current for a desired optical power may be obtained.

Figure 2:
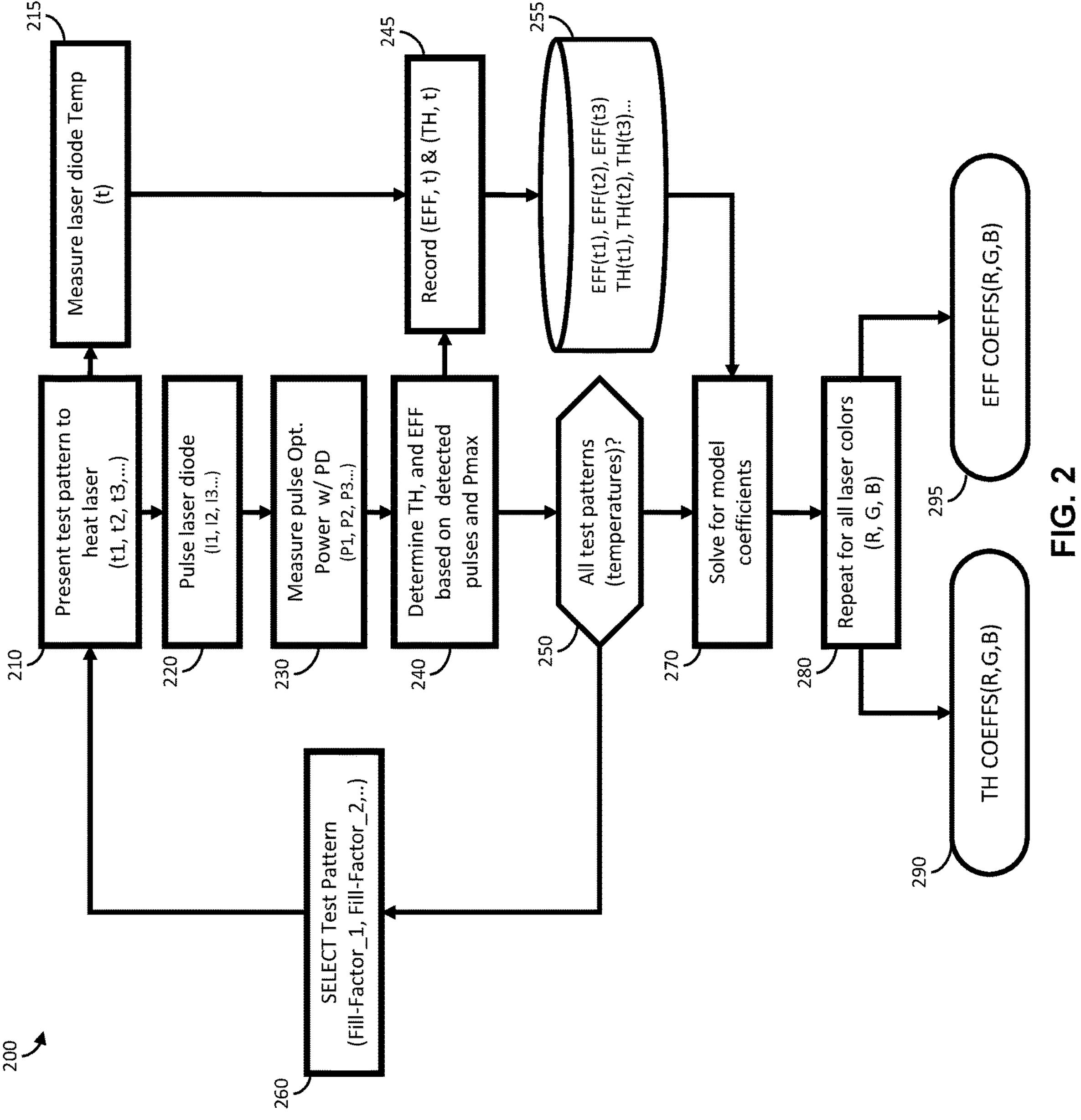
FIG. 2 is a flowchart of a method for calibrating a laser display according to a possible implementation of the present disclosure.

FIG. 2 is a flowchart of a method for calibrating a laser display (i.e., calibration process) according to a possible implementation of the present disclosure. The laser display may be a flying-spot projector, such as shown in FIG. 1, and the calibration process may take place at a time of fabrication (i.e., factory set). In other words, the calibration process may be different from an operating process (i.e., method for controlling the laser display) for at least the reason that the calibration process may include the use of a photodiode, whereas the operating process may not require the photodiode. The calibration process will be described for a single laser and the same process may be repeated for each of a plurality of lasers.

The calibration process (i.e., method 200) may include heating the laser diode to a first temperature (t1). The heating may include presenting a test pattern on the display by scanning the laser diode to display a pattern that fills the display area according to a display fill-factor (i.e., fill-factor) . Because a higher fill-factor requires more laser ON time for a scan than a lower fill-factor, the amount of heating may correspond to the fill-factor of the test pattern. Accordingly, to heat the laser diode to the first temperature (t1), a first test pattern having a first fill-factor may be presented 210 on the display.

The method 200 further includes measuring 215 the temperature of the laser diode using a temperature sensor. After the laser diode has reached the first temperature (t1) (and has stabilized), the method 200 includes, pulsing 220 the laser diode at different drive currents (I1, I2, I3, etc.) and measuring 230 (i.e., detecting) the corresponding optical power (P1, P2, P3,etc.) for each drive current pulse. After a generating a plurality of pulses of light from the laser diode using the plurality of drive currents, the method 200 further includes determining 240 an efficiency of the laser diode at the first temperature (i.e., EFF(t1)) and a threshold of the laser diode at the first temperature (i.e., TH(t1)). This determination may be based on an approximate L-I curve corresponding to the plurality drive-current and optical power pairs (e.g., (I1, P1), (I2, P2), (I3, P3), etc.) measured for the first temperature. The threshold and the efficiency for the first temperature (t1) may then be recorded 245 in a memory 255 and the process may be repeated for other temperatures (t2, t3, etc.).

The method 200 may be repeated to determine a plurality of thresholds and a plurality of efficiencies for the laser diode at a plurality of temperatures until 250 all test patterns (i.e., temperatures) have been considered. For example, the method 200 may further include selecting 260 a second test pattern having a second fill-factor that is higher than the first fill-factor and then heating the laser diode to a second temperature (t2) that is higher than the first temperature (t1) by presenting the second test pattern on the display.

After a plurality of thresholds for a plurality of temperatures have been recorded, the method 200 may include computing a threshold model (i.e., threshold equation) of the laser diode, which describes how the threshold of the laser diode varies with temperature. Likewise, after a plurality of efficiencies for a plurality of temperatures have been recorded, the method 200 may further include computing an efficiency model (i.e., efficiency equation) of the laser diode, which describes how the efficiency of the laser diode varies with temperature. Computing these models may include solving 270 each model equation for model coefficients based on the efficiencies and thresholds computed for different temperatures.

In one possible implementation, the threshold model relates the threshold (TH) of the laser diode to the temperature (t) using a polynomial equation given below;

$$TH(t)=a_{TH}t^3 b_{TH}t^2+c_{TH}t+d_{TH} \quad (1)$$

where $a_{TH}$, $b_{TH}$, $c_{TH}$, $d_{TH}$ are coefficients determined based on the thresholds computed for the multiple temperatures.

In another possible implementation, the threshold model relates the threshold (TH) of the laser diode to the temperature (t) using an exponential equation given below;

$$TH=(t)=a_{TH}\exp(b_{TH}t+d_{TH})+e_{TH} \quad (2)$$

where $a_{TH}$, $b_{TH}$, $d_{TH}$, $e_{TH}$ are coefficients determined based on the thresholds computed for the multiple temperatures.

In another possible implementation, the efficiency model relates the efficiency (EFF) of the laser diode to the temperature (t) using a polynomial equation given below;

$$EFF(t)=a_{EFF}t^3b_{EFF}t^2+c_{EFF}t+d_{EFF} \quad (3)$$

where $a_{EFF}$, $b_{EFF}$, $d_{EFF}$, $d_{EFF}$ are coefficients determined based on the efficiencies computed for the multiple temperatures.

As mentioned, the method 200 may be repeated 280 for other laser diodes in the display. For example, the method 200 may include computing a threshold model (i.e., threshold coefficients 290) for a red laser-diode, a blue laser-diode, and a green laser-diode. The method 200 may further include computing an efficiency model (i.e., efficiency coefficients 295) for a red laser-diode, a blue laser-diode, and a green laser-diode.

Figure 3:
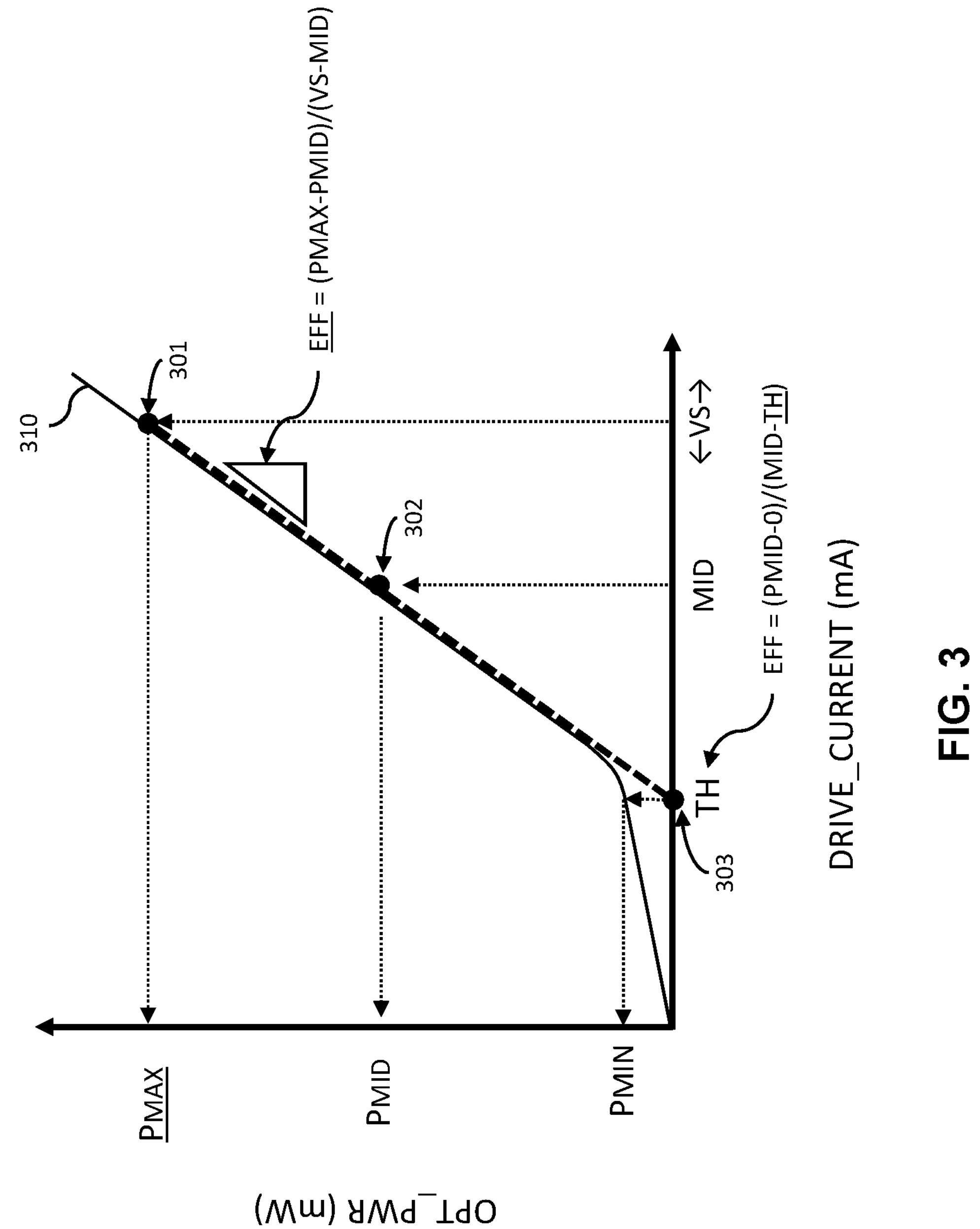
FIG. 3 is a graph of optical power versus drive current for a laser diode according to a possible implementation of the present disclosure.

FIG. 3 is a graph of optical power (OPT_PWR) versus drive current (DRIVE_CURRENT) for a laser diode (i.e., an L-I curve) according to a possible implementation of the present disclosure. The graph illustrates how the efficiency (EFF) and threshold (TH) can be computed from measurements at a given temperature.

Determining (i.e., computing) efficiency may include determining a first data-point 301. The first data-point is determined by adjusting the laser-diode driver to generate a maximum level (VS) to achieve a target optical power ($P_{MAX}$). The target optical power ($P_{MAX}$) may be a predetermined value based on a brightness and/or whitepoint desired for the display. Computing efficiency may further include determining a second data-point 302. The second data-point 302 may be determined as a mid-range optical power (PMID) by reducing the drive current to a level (MID) below the maximum drive current level (VS). For these drive currents (i.e., MID, VS), the L-I curve 310 of the laser diode can be approximated by a straight line, and the efficiency (EFF) of the laser diode can be determined as the slope of the line connecting the first data-point 301 and the second data-point 302 (i.e., $EFF=(P_{MAX}-P_{MID})/(VS-MID)$).

Figure 4:
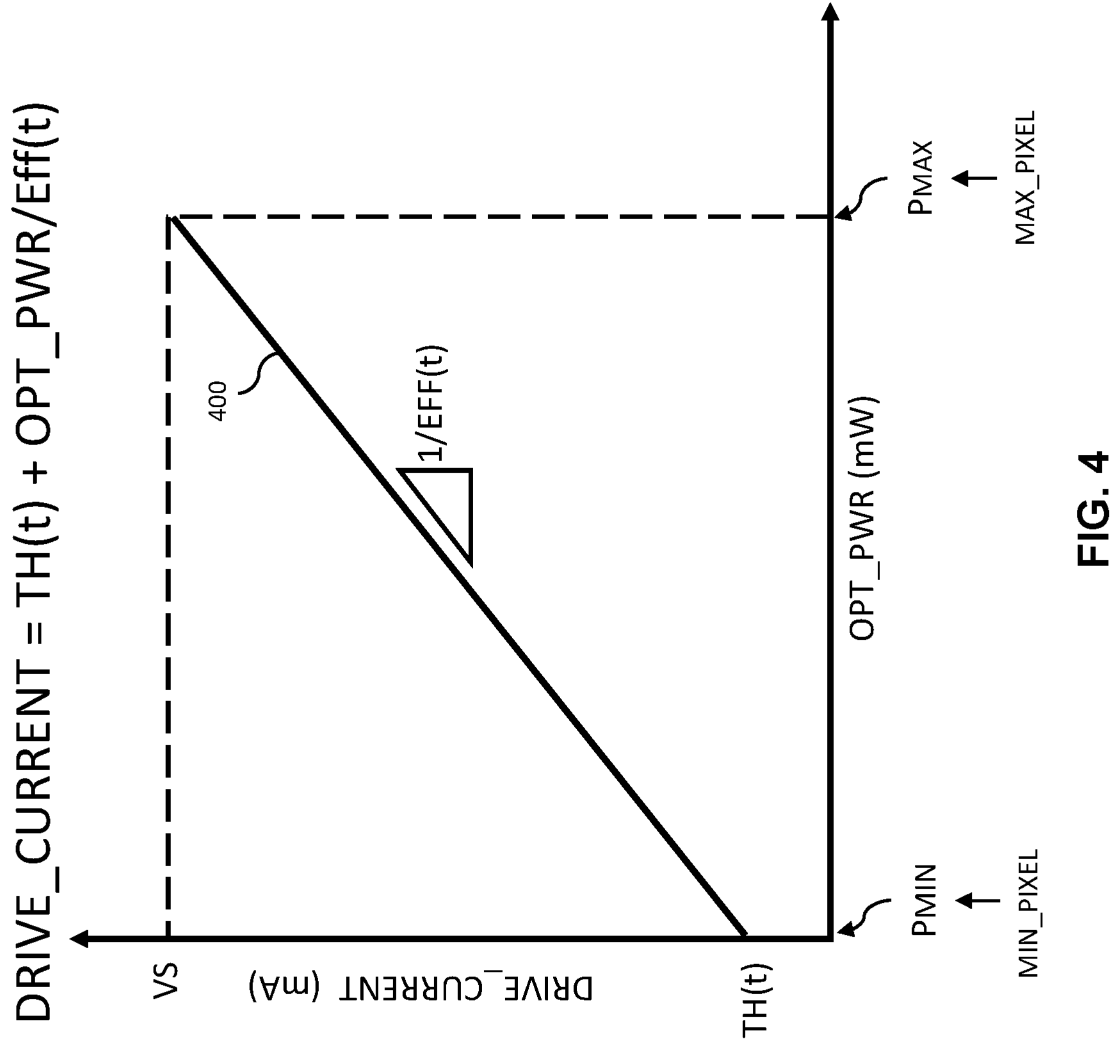
FIG. 4 is a graph that visually represents a look-up table according to a possible implementation of the present disclosure.

Determining (i.e., calculating) threshold may include determining a third data point 303 by extrapolating the line defined by the first data-point 301 and the second data-point 302. In other words, the threshold current (TH) may be defined as the current on the approximation of the L-I curve (i.e., dotted line) that results in zero optical power (i.e., EFF=(PMID−0)/(MID−TH)). In practice the threshold current (TH) results in the minimum optical power ($P_{MIN}$) generated by the display. This minimum optical power may be measured and determined to ensure that it is above a minimum sustainable emission for the laser diode and to help relate pixel values to optical powers. This approximation of the L-I curve (dotted line) may be used as the calibration for the laser diode for a given temperature FIG. 4 is a graph that visually represents a calibration line according to a possible implementation of the present disclosure. In particular, the calibration line 400 is the approximation to the L-I curve described previously. The calibration line 400 is graphed in FIG. 4 as drive current (DRIVE_CURRENT) versus optical power (OPT_PWR). The graph shows that the relationship between the drive currents and the optical powers of the calibration may be expressed as a linear equation (shown below) that depends on the threshold and the efficiency of the laser diode.

$$\text{DRIVE\_CURRENT} = TH(t) + \frac{\text{OPT\_PWR}}{EFF(t)} \quad (4)$$

In practice, the calibration line 400 may be implemented as a relationship such as a look-up table (LUT) including points along the calibration line. The look-up table approach may be less complicated (e.g., faster) to implement than computing the equation of the line for each pixel. In some implementations, the calibration line 400 may be implemented as a relationship that is not in the form of a look-up table (LUT), but includes points along the calibration line, such as a database.

Figure 5:
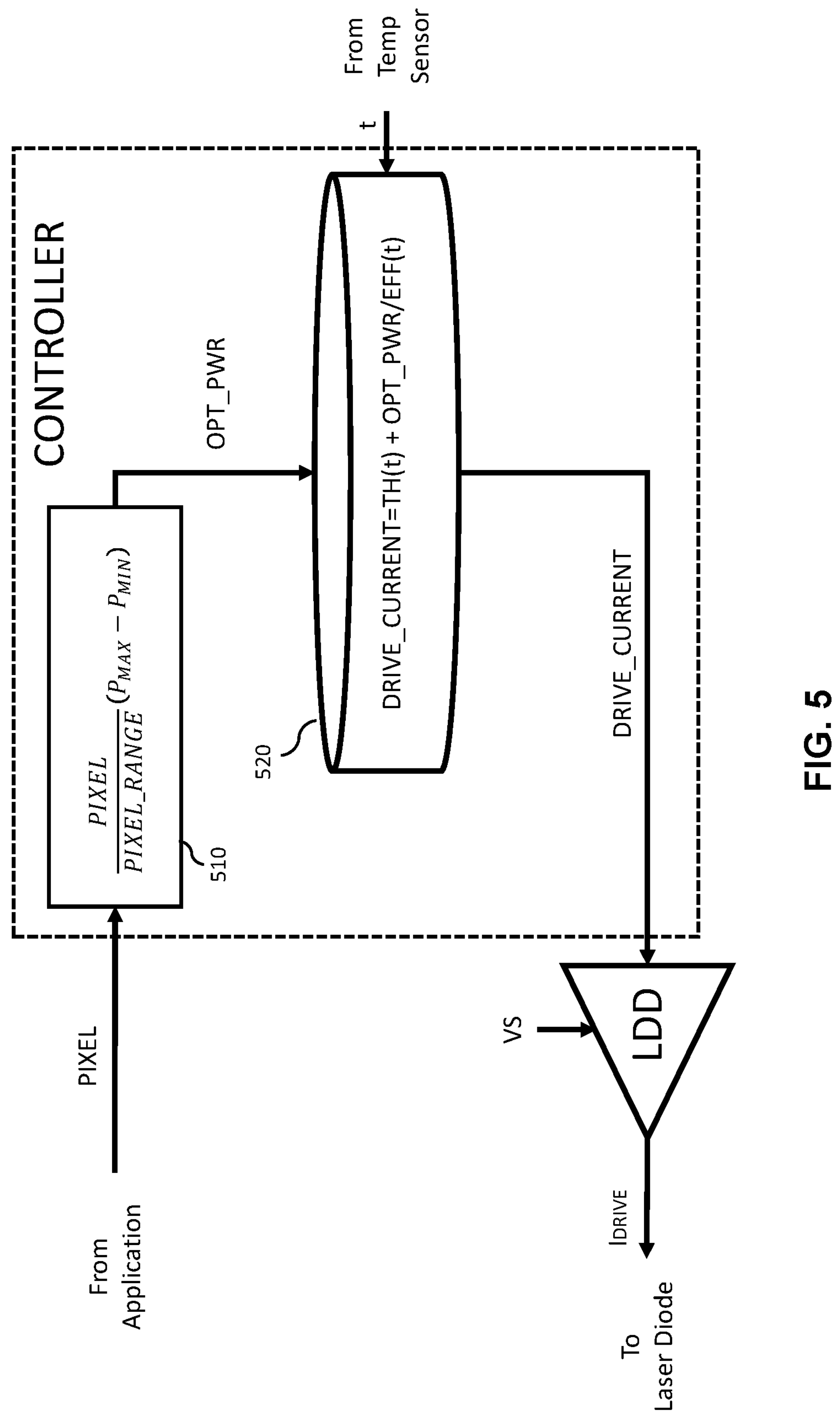
FIG. 5 is a flow chart illustrating functions of a laser display system according to a possible implementation of the present disclosure.

FIG. 5 is a flow chart illustrating functions of a laser display system according to a possible implementation of the present disclosure. The functions may be implemented as a software program recalled from a non-transitory storage medium to configure a processor (e.g., controller) to perform all, or a portion, of the operations necessary to carry-out the functions.

In a pixel-conversion function 510, an image (e.g., from an application) including a pixel may be converted to an optical power (OPT_PWR). For example, a range of pixels (PIXEL_RANGE) may correspond to a range of optical powers ($P_{MAX}-P_{MIN}$) for the display. Accordingly, a pixel may be related to an optical power by the equation below.

$$\text{OPT\_PWR} = \frac{\text{PIXEL}}{\text{PIXEL\_RANGE}}(P_{MAX} - P_{MIN}) \quad (5)$$

In a drive current look-up function 520, the optical power determined by the pixel-conversion function 510 may be used to query a LUT stored in a memory (e.g., a memory of the controller). The LUT corresponds to the calibration line described previously. This calibration line can be updated using a temperature (t) from a temperature sensor proximate to the laser diode (e.g., on the same die as the laser diode). In particular, the drive current look-up function 520 may include a LUT adjustment function in which the values of the LUT are altered based on a threshold calculation function and an efficiency calculation function.

Figures 6A, 6B:
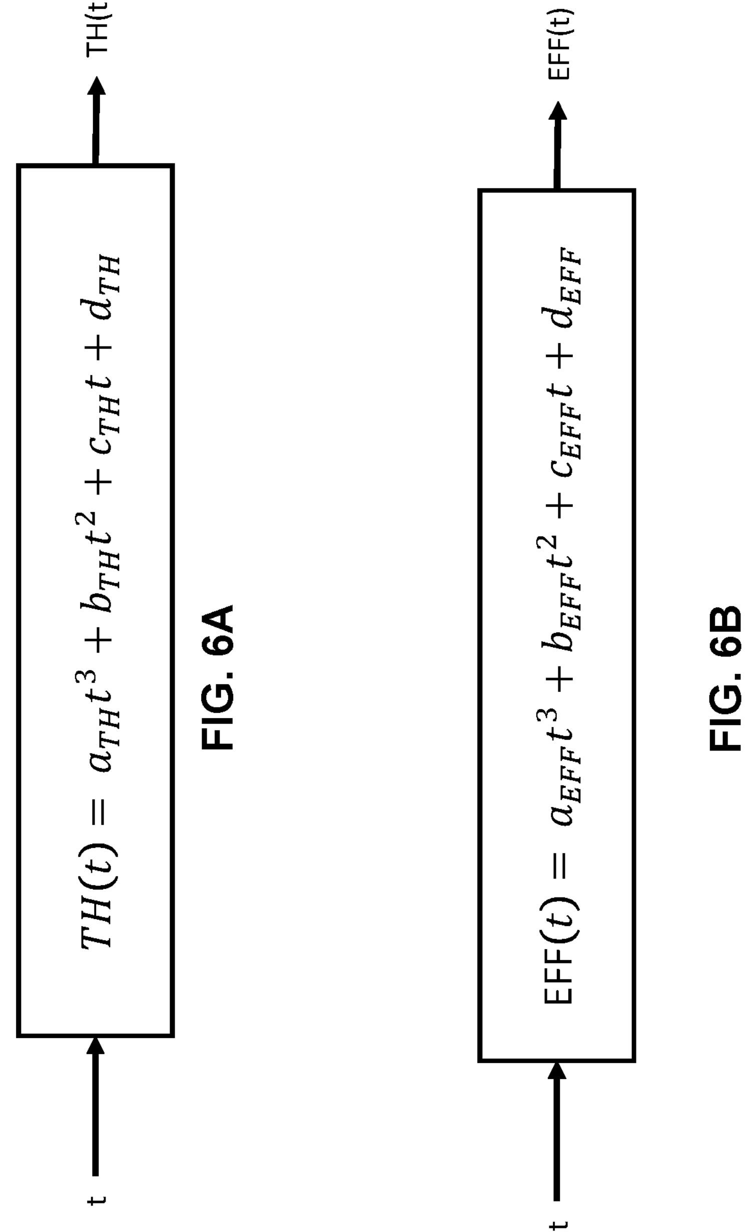
FIG. 6A illustrates a threshold calculation function according to a possible implementation of the present disclosure.
FIG. 6B illustrates an efficiency calculation function according to a possible implementation of the present disclosure.

FIG. 6A illustrates a threshold calculation function according to an implementation of the present disclosure. The threshold calculation function includes applying the measured temperature to a threshold mode in which the threshold coefficients were derived during the calibration process (see FIG. 2).

FIG. 6B illustrates an efficiency calculation function according to an implementation of the present disclosure. The efficiency calculation function includes applying the measured temperature to a threshold mode in which the threshold coefficients were derived during the calibration process (see FIG. 2).

The drive current look-up function 520 may result in a drive current (DRIVE_CURRENT) transmitted to the laser diode driver (LDD) which can generate (e.g., according to a gain corresponding to VS) an analog drive signal ($I_{DRIVE}$) that can configure the laser diode to emit light (e.g., red light, blue light, or green light) at the optical power corresponding to the pixel.

Figure 7:
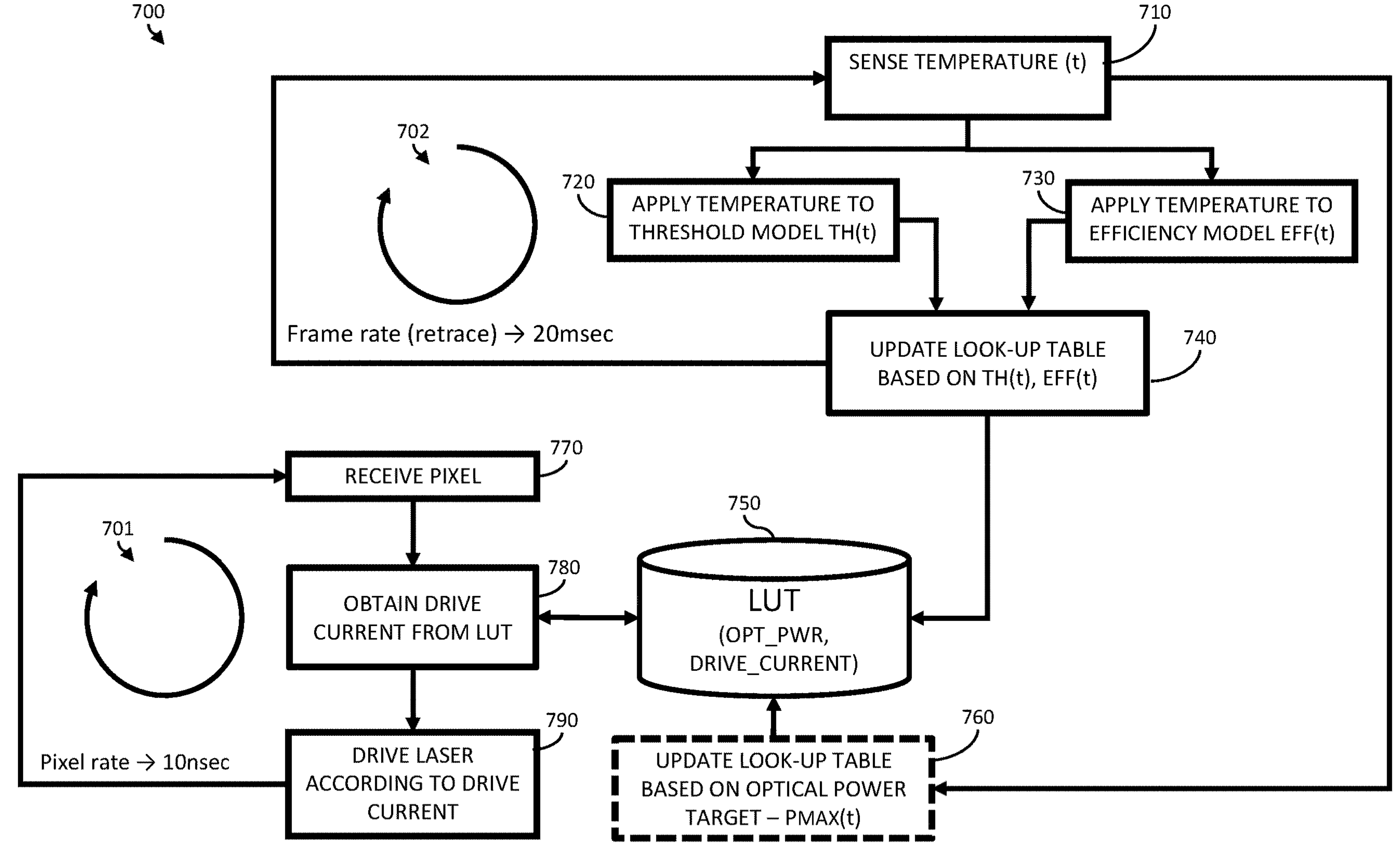
FIG. 7 is a flow chart of a method for controlling a laser display according to a possible implementation of the present disclosure.

FIG. 7 is a flow chart of a method for controlling a laser display according to a possible implementation of the present disclosure. The method may be carried automatically at a time of operation of the display. In other words, the method may be carried after the threshold model and the efficiency models have been computed. The method 700 shown in FIG. 7 may be carried out for each color laser in the laser display. For example, a pixel in the display can include a red sub-pixel (i.e., red pixel), a blue sub-pixel pixel (i.e., blue pixel) and a green sub-pixel (i.e., green pixel). Accordingly, the method may determine a red drive-current to cause a red laser-diode to emit a red optical-power corresponding to the red pixel, a blue drive-current to cause a blue laser-diode to emit a blue optical-power corresponding to the blue pixel, and a green drive-current to cause a green laser-diode to emit a green optical-power corresponding to the green pixel.

The method 700 includes two loops. A first loop 701 updates the optical power emitted by the laser diode based on each pixel in a frame of pixels. A second loop 702 updates the look-up table (LUT) based on a measured temperature of the laser diode. The first loop 701 and the second loop 702 operate at different timescales. For example, the first loop 701 may repeat at a pixel rate (e.g., approximately 10 nanoseconds) so that each pixel in a frame of pixels may receive the appropriate optical power. The second loop 702 is configured to repeat at a rate that is slower than the pixel rate but faster than temperature changes in the laser diode. For example, the second loop may repeat at a frame rate (e.g., approximately 20 milliseconds) so that the drive current for a given optical power is accurate for the measured temperature.

The method includes receiving 770 a pixel for display on the laser display. The method further includes obtaining 780 a drive-current for the pixel from a look-up table 750. Obtaining the drive-current may include determining an optical power corresponding to the pixel and then determining a drive-current corresponding to the optical power from the look-up table 750. The method further includes driving 790 the laser diode according to the drive current obtained from the look-up table.

The look-up table 750 may be implemented as a database of optical power values related to drive current values. The optical-power values, the drive-current values, and/or the relationship therebetween may be based on a threshold (TH(t)) of the laser diode at a temperature (t) and an efficiency (EFF(t)) of the laser diode at the temperature (t).

The optical power target ($P_{MAX}$(t)) for the laser display may also change with temperature so in a possible implementation, the method 700 includes updating 760 the look-up table 750 based on changes in the optical power target caused by corresponding changes in the temperature (t) of the laser diode.

To update the look-up table 750, the method 700 may include sensing 710 a temperature (t) of the laser diode. The temperature is then applied 720 to the threshold model to compute an updated threshold of the laser diode. The temperature is also applied 730 to the efficiency model to compute an updated the efficiency of the laser diode. The look-up table 740 may be updated based on the updated threshold and updated efficiency.

In the specification and/or figures, typical embodiments have been disclosed. The present disclosure is not limited to such exemplary embodiments. For example, an approximation to the L-I curve different from the 3-point linear approximation described here may be used to define the relationship between optical power and drive current.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

What is claimed is:

1. A laser display comprising:

a light engine including a laser diode and a temperature sensor configured to measure a temperature of the laser diode; and a controller coupled to the light engine configured to receive the temperature, the controller configured to:

determine an optical power corresponding to a pixel for display;

determine a drive-current for the optical power based on a calibration line defining optical powers for respective drive-currents, the calibration line being based on:

a threshold of the laser diode at the temperature computed using a threshold model of the laser diode; and an efficiency of the laser diode at the temperature computed using an efficiency model of the laser diode; and transmit the drive-current to a driver configured to supply the drive-current to the laser diode.

2. The laser display according to claim 1, wherein the driver is configured to supply the laser diode with an analog current corresponding to the drive- current to emit light at the optical power.

3. The laser display according to claim 1, further comprising:

a scanning mirror assembly configured to scan a light emitted from the laser diode in response to the drive-current.

4. The laser display according to claim 3, further comprising:

display optics configured to focus the light, from the scanning mirror assembly, to form an image at an eye of a user.

5. The laser display according to claim 1, wherein:

the laser diode is a first laser diode;

the light engine further includes a second laser diode and a third laser diode, the first laser diode, the second laser diode, and the third laser diode being disposed on a die; and the temperature sensor being disposed on the die so that the temperature measured corresponds to the temperature of the first laser diode, the second laser diode, and the third laser diode.

6. The laser display according to claim 5, wherein the drive-current is a first drive-current for the first laser diode, the calibration line is implemented as a look-up table, the controller further configured to:

obtain a second drive-current for the second laser diode from the look-up table;

obtain a third drive-current for the third laser diode from the look-up table; and transmit the first drive-current to the first laser diode, the second drive-current to the second laser diode, and the third drive-current to the third laser diode to generate a color pixel.

7. The laser display according to claim 1, wherein the threshold model relates the threshold (TH) of the laser diode to the temperature (t) using a polynomial equation or an exponential equation.

8. The laser display according to claim 1, wherein the efficiency model relates the efficiency (EFF) of the laser diode to the temperature (t) using a polynomial equation.

9. The laser display according to claim 1, wherein the calibration line is a linear equation that relates optical power (OPT_PWR) to drive-current (DRIVE_CURRENT).

10. The laser display according to claim 2, wherein the driver has an adjustable gain set so that a maximum drive-current corresponds to a target optical power based on a brightness for the laser display.

11. The laser display according to claim 3, wherein the scanning mirror assembly includes:

a fast mirror configured to scan light along rows of the laser display; and a slow mirror configuration to scan the light between the rows of the laser display.

12. The laser display according to claim 6, wherein:

the color pixel includes light from the first laser diode, the second laser diode and the third laser diode; and has a brightness based on a gain of the driver.

13. The laser display according to claim 7, wherein the polynomial equation is:

$$TH(t)=a_{TH}t^3+b_{TH}t^2+c_{TH}t+d_{TH}; \text{ and}$$

wherein, $a_{TH}$, $b_{TH}$, $c_{TH}$, $d_{TH}$ are coefficients determined using a calibration process for the laser diode.

14. The laser display according to claim 7, wherein the exponential equation is:

$$TH=(t)=a_{TH}\exp(b_{TH}t+d_{TH})+e_{TH}; \text{ and}$$

where $a_{TH}$, $b_{TH}$, $d_{TH}$, $e_{TH}$ are coefficients determined using a calibration process for the laser diode.

15. The laser display according to claim 8, wherein the polynomial equation is:

$$EFF(t)=a_{EFF}t^3b_{EFF}t^2+c_{EFF}t+d_{EFF}; \text{ and}$$

where $a_{EFF}$, $b_{EFF}$, $d_{EFF}$, $d_{EFF}$ are coefficients determined using a calibration process for the laser diode.

16. The laser display according to claim 9, wherein the linear equation is:

$$DRIVE\_CURRENT = TH(t) + \frac{OPT\_PWR}{EFF(t)};$$

wherein, TH (t) is the threshold of the laser diode at the temperature(t) and EFF(t) is the efficiency of the laser diode at the temperature.

17. A method for controlling a laser display, comprising:

determining an optical power corresponding to the a pixel for display on the laser display;

determining a drive-current for the optical power from a calibration line defining optical powers for respective drive-currents, the calibration line being based on:

a threshold of a laser diode of the laser display at a temperature, the threshold computed using a threshold model of the laser diode; and an efficiency of the laser diode at the temperature computed using an efficiency model of the laser diode; and transmitting the drive-current to a driver configured to supply the drive-current to the laser diode so that the laser diode emits light at the optical power.

18. The method for controlling the laser display according to claim 17, further comprising:

scanning the light at the optical power to a position in a raster scan using mirrors.

19. The method for controlling the laser display according to claim 17, wherein the calibration line is a look-up table, the temperature is a first temperature measured at a first time, the threshold is a first threshold, and the efficiency is a first efficiency, the method further comprising:

measuring a second temperature at a second time;

computing a second threshold of the laser diode at the second temperature using the threshold model;

computing a second efficiency of the laser diode at the second temperature using the efficiency model; and updating the look-up table based on the second threshold and the second efficiency.

20. The method for controlling the laser display according to claim 17, wherein the calibration line is a look-up table, pixel is a red pixel, the laser diode is a red laser-diode, the light is red light, the optical power is a red optical- power, and the drive-current is a red drive-current, the method further including:

receiving a blue pixel for display on the laser display;

determining a blue optical-power corresponding to the blue pixel;

determining a blue drive-current for the blue optical-power from the look-up table, the look-up table based on:

a threshold of a blue laser-diode of the laser display at the temperature, the threshold of the blue laser-diode computed using a threshold model of the blue laser-diode; and an efficiency of the blue laser-diode at the temperature computed using an efficiency model of the blue laser-diode;

transmitting the blue drive-current to the driver configured to supply the blue drive-current to the blue laser-diode so that the blue laser-diode emits blue light at the blue optical- power;

receiving a green pixel for display on the laser display;

determining a green optical-power corresponding to the green pixel;

determining a green drive-current for the green optical-power from the look-up table, the look-up table based on:

a threshold of a green laser-diode of the laser display at the temperature, the threshold of the green laser-diode computed using a threshold model of the laser diode; and an efficiency of the green laser-diode at the temperature computed using an efficiency model of the green laser-diode; and transmitting the green drive-current to the driver configured to supply the green drive- current to the green laser-diode so that the green laser-diode emits green light at the green optical-power.

* * * * *